United States Patent [19]

Hertrich et al.

[11] Patent Number: 4,600,963
[45] Date of Patent: Jul. 15, 1986

[54] CIRCUIT ARRANGEMENT TO PROTECT A SEMI-CONDUCTOR SWITCH WHICH CAN BE ACTIVATED WITHOUT CONTACT (REMOTELY)

[75] Inventors: Wolfgang Hertrich, Aichtal; Volker Fritsch, Stuttgart, both of Fed. Rep. of Germany

[73] Assignee: Euchner & Co., Fed. Rep. of Germany

[21] Appl. No.: 574,609

[22] Filed: Jan. 27, 1984

[30] Foreign Application Priority Data

Jan. 28, 1983 [DE] Fed. Rep. of Germany ....... 3302864

[51] Int. Cl.[4] .............................................. H02H 3/08
[52] U.S. Cl. ..................................... 361/101; 361/94; 361/98
[58] Field of Search ...................... 361/98, 101, 94, 93, 361/95, 96, 31, 100, 74, 75

[56] References Cited

U.S. PATENT DOCUMENTS

| | | | |
|---|---|---|---|
| 3,329,870 | 7/1967 | DeViney et al. | 361/95 |
| 3,936,700 | 2/1976 | Reiter | 361/75 |
| 4,271,448 | 6/1981 | Pond | 361/93 |
| 4,277,811 | 7/1981 | Sato | 361/98 X |
| 4,355,342 | 10/1982 | Franzolini | 361/101 X |
| 4,438,473 | 3/1984 | Cawley et al. | 361/101 X |

Primary Examiner—A. D. Pellinen
Assistant Examiner—T. DeBoer
Attorney, Agent, or Firm—Wigman & Cohen

[57] ABSTRACT

A circuit arrangement for protecting a remotely controllable semi-conductor switch which closes to interrupt an alternating current circuit in order to protect against an overload is disclosed in which a flip-flop is connected to control the operation of a current control circuit connected to the output of the semi-conductor switch in the event of an overload or short-circuit condition in the AC circuit. Provision may also be made for transient overload conditions, as well as providing a visual indication of the conducting condition of the semi-conductor switch.

7 Claims, 3 Drawing Figures

CIRCUIT ARRANGEMENT TO PROTECT A SEMI-CONDUCTOR SWITCH WHICH CAN BE ACTIVATED WITHOUT CONTACT (REMOTELY)

BACKGROUND OF THE INVENTION

This invention relates to a circuit arrangement to protect a remotely controllable semi-conductor switch, which serves to close and interrupt an alternating current circuit, against overload.

With semi-conductor switches of the above type, there is a danger of destruction if the load lying in the alternating current circuit is by-passed or bridged while the switch is closed, such as is the case in a short-circuit. The current through the switch is then only limited by the inner resistance of the voltage source and the dynamic resistance of the switch. This limit value, however, generally lies far in excess of the maximum permissible current for the semi-conductor switch.

In order to limit the current enough, in the case of a short circuit, so that it can still be disconnected from the semi-conductor switch, it is known to insert a protective resistor in the electrical circuit. A protective resistor of this type, however, does not increase only the circuit expense. Above all, it results in a relatively large amount of waste heat, which is disadvantageous for several reasons. More favorable, therefore, is a different known solution (DE-OS No. 25 45 919), in which as current limiting device with variable resistance and a current monitoring device lie in the path of the current of the semi-conductor switch, which is formed as a thyristor. As long as the nominal current is not exceeded, the resistance of the current limiting device is relatively slight. It does not increase automatically in case of a short circuit until a value is reached which limits the short-circuit current by means of the thyristor to a value at which switching can still take place. The current monitoring device acts in case of a short circuit on the trigger of the thyristor and closes the starting voltage. The expense of the circuit for this solution, however, is relatively large.

The circuit expense is smaller in another known circuit arrangement of the above-described, type (DE-OS No. 31 15 214). Here a MOS-FE is connected in series with the thyristor forming the semi-conductor switch and a solid resistor necessary for the current monitoring. This MOS-FET is switched into the blocked condition in case of a short circuit or when there is a time delay at excess current, thereby practically blocking the path of the current in which the thyristor lies. The disadvantage of this solution is that a thyristor is necessary to control the MOS-FET which has to be triggered if the MOS-FET is to be switched into the blocked condition. The triggering voltage of thyristors is relatively large. To the extent that protection is to be provided not only for the case of a short circuit, but also for cases of excess current, a relatively larger margin of safety from the maximum permissible excess current must be maintained. In addition, a thyristor cannot be integrated into a miniaturized circuit because of the space it requires.

SUMMARY AND OBJECTS OF THE INVENTION

The object of the invention, therefore, is to create a circuit arrangement to protect a remotely controllable semiconductor switch, the triggering value of which can be held within narrow limits without requiring an increased expense. This object is achieved with a circuit arrangement having the characteristics of claim 1.

The use of a flip-flop to produce the control signal for the transistor of the current limiting device in place of a thyristor permits not only the maintenance of a narrow tolerance range of the reaction value at a very large expense, but also makes it possible to miniaturize the control element and integrate it into a miniaturized circuit. An additional advantage of to the invention is that it allows an automatic return of the transistor of the current control circuit to the conducting condition, using simple circuitry means. This transistor is preferably a bipolar transistor or an MOS-FET transistor, since their use achieves a very low voltage drop in the conducting condition and a sufficiently lower amount of current in the blocked condition such that the self-holding current of a thyristor forming the semi-conductor switch is not exceeded. Therefore, it is not necessary to disconnect the semi-conductor switch with the aid of its trigger circuit.

The transistor of the current control circuit can be connected by means of a resistor with the output of a flip-flop, which shifts from the high to the low potential in case of an overload. The expense for the control element is then minimal.

With the aid of the flip-flop, the control element can be formed without significant additional expense in such a manner that it can only switch the transistor back into the conducting condition after the supply voltage has been turned off and back on, or that this switching can take place only after a selectable period of time. For the former case, the flip-flop need only be connected with one resistor, and for the latter it needs to be connected with a condensor and a resistor, whereby the time constant of this RC member is determinative of the desired time delay between the occurrence of the short circuit or overload and the return of the transistor into the conducting condition.

In the solution according to the invention, the current sensor can also be provided at a very limited expense and with a circuit that is capable of miniaturization. To the extent that it does not need to have a delayed reaction to an overload, it is adequate to control the flip-flop by means of a transistor and its control by means of a resistor which connects the input of this transistor with the pick-up at the resistor of the current sensor. In order to prevent a reaction to a brief overload, only one condensor needs to be added, which, together with the resistor coupling the transistor to the resistor of the current sensor, forms an RC member connected in parallel to the resistor of the current sensor.

In order not to delay the cut-off in case of a short circuit or a very high overload, despite the non-reaction to brief overloads or current impulses, the current sensor circuit need only include a second transistor, the output of which is connected with the input of the flip-flop and the control input of which is connected with the pick-up of resistive voltage network connected in parallel to the resistor of the current sensor. The dividing of this voltage network thereby determines the upper limit of current at which the reaction delay is ineffective, i.e. where the flip-flop is triggered without delay.

In order to be able to tell easily whether the current strength lies beneath the maximum permissible value, whether the circuit arrangement is working properly, or whether a short circuit or an overload exists, in a preferred exemplary embodiment of the invention an illuminating display device is provided, which indicates the switch condition of the transistor. In another exemplary embodiment of this illuminated display device, a diode or a series-connected group of diodes is connected in the current path possing through the semiconductor switch, the transistor and the current sensor. An illuminating diode with series resistance is connected parallel to this diode or series connection of several diodes. This illuminating diode lights up when the current flowing through the transistor is beneath its maximum value. In contrast, it does not light up when, as a result of a short circuit, or too high of a current the transistor has been switched into the non-conducting condition, because then the voltage drop at the diode or series-connected diodes, which form(s) the operational voltage for the illuminating diode, has been reduced to practically its zero value. The generation of a voltage drop for the operation of the illuminating diode with the aid of one or more diodes is advantageous to the extent that the voltage drop is then largely independent of the strength of the current flowing through the semi-conductor switch and the transistor.

If the flip-flop with a predetermined time delay is switched back after the occurrence of a short circuit or an overload, thereby bringing the transistor back into the conducting condition in order to perform an interrogation, whether the short circuit or overload still exists, the diode flashes at a frequency which matches that of a cycle-frequency. This frequency is the same as that at which the flip-flop performs the interrogation, whether the short circuit or overload is still present. Of course, it would also be possible to connect the illuminating diode to the control element, for example to the output of the flip-flop controlling the transistor.

BRIEF DESCRIPTION OF THE DRAWINGS

The invention is described in greater detail below on the basis of two exemplary embodiments illustrated in the drawings. Shown are.

DETAILED DESCRIPTION OF THE PREFERRED EMBODIMENT

Figure 1:
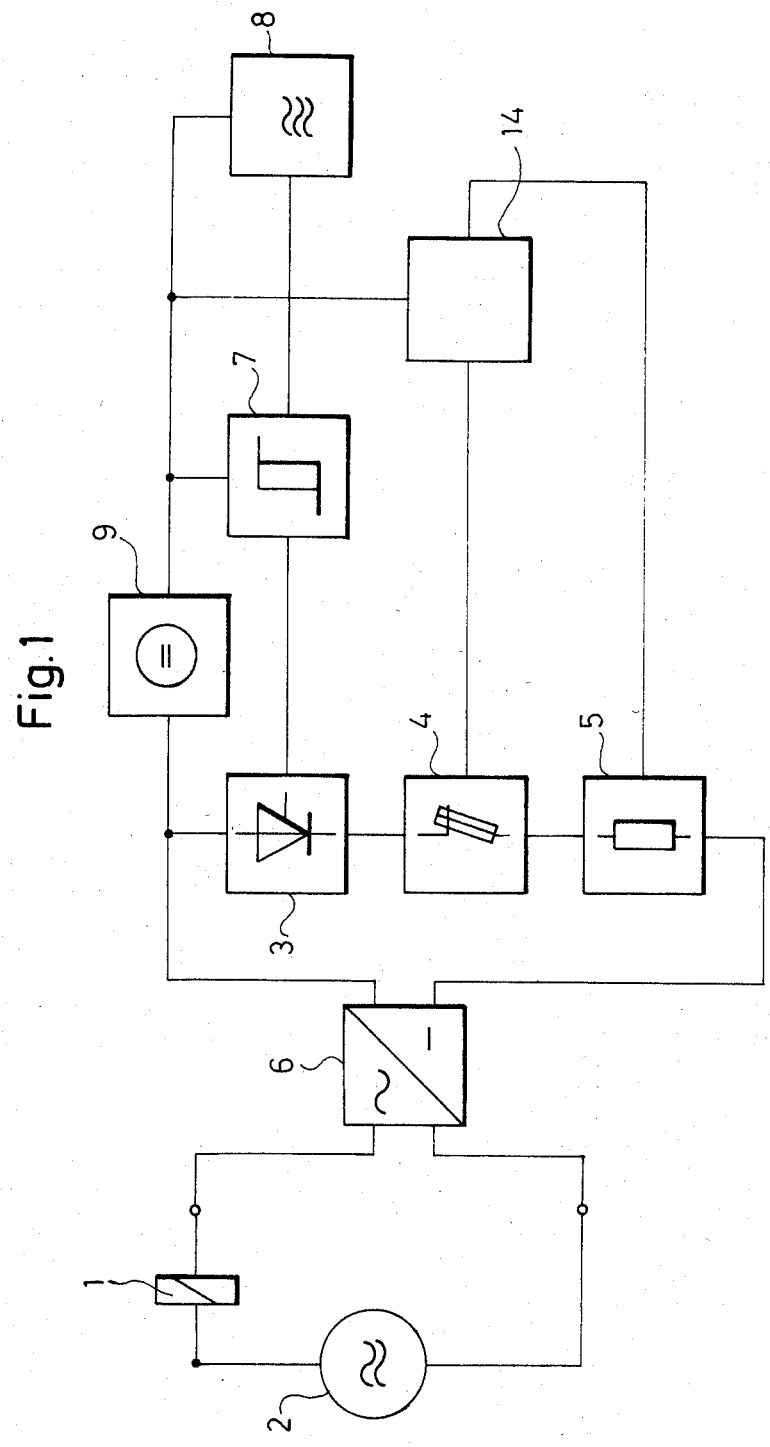
FIG. 1 is a block circuit diagram of the first exemplary embodiment.

For the closing and opening of the electrical circuit of a load 1, which is connected to an alternating current source 2 having a voltage between 24 volts and 250 volts, a thyristor 3 is provided which, as shown in FIG. 1, is connected in series with an element 4 of an electronic current control circuit and an element 5 of a current sensor. This series circuit is connected to the direct current outputs of a rectifier bridge 6, the alternating current input of which is connected on one side with the load 1 and on the other side with the alternating current source 2. When the thyristor 3 is positioned in the conducting condition, a current flows from the alternating current source 2 through the load 1, the rectifier bridge 6, the thyristor 3, the elements 4 and 5 and then back through the rectifier bridge 6 to the alternating current source 2.

The trigger electrode of the thyristor 3 is connected to a trigger circuit 7, which, like an oscillator 8 of an approximation circuit (not shown in greater detail) which controls this trigger circuit, receives the necessary operating voltage via a voltage regulator 9. This voltage regulator 9 is connected to the direct current output of the rectifier bridge 6, as shown in FIGS. 1 and 2.

The element 4 of the current control circuit connected in series with the thyristor 3 and the element 5 of the current sensor serves to prevent so large a current from flowing through the thyristor 3 that it could lead to a destruction of the thyristor 3, in case the load 1 is bridged, as can occur in a short circuit. The element 4 of the current control circuit in the exemplary embodiment consists of an MOS-FET transistor 10. However, a bipolar transistor could also be used in its place. The use of the first-mentioned type of transistor, a drain-source resistance of less than 0.5 ohms can be attained.

The element 5 of the current sensor is formed by an resistor $R_1$, which has a voltage drop which is proportional to the current flowing through the thyristor 3. The voltage is connected to the base of a transistor 11 via a resistor $R_2$, which transistor 11 has an emitter connected to ground, like the pole of the resistor $R_1$ that does not serve as a pick-up, while the collector is to the regulated output voltage of the voltage regulator 9 by means of a resistor $R_3$. The transistor 11 and the resistors $R_2$ and $R_3$ form an additional element of the current sensor.

Figure 2:
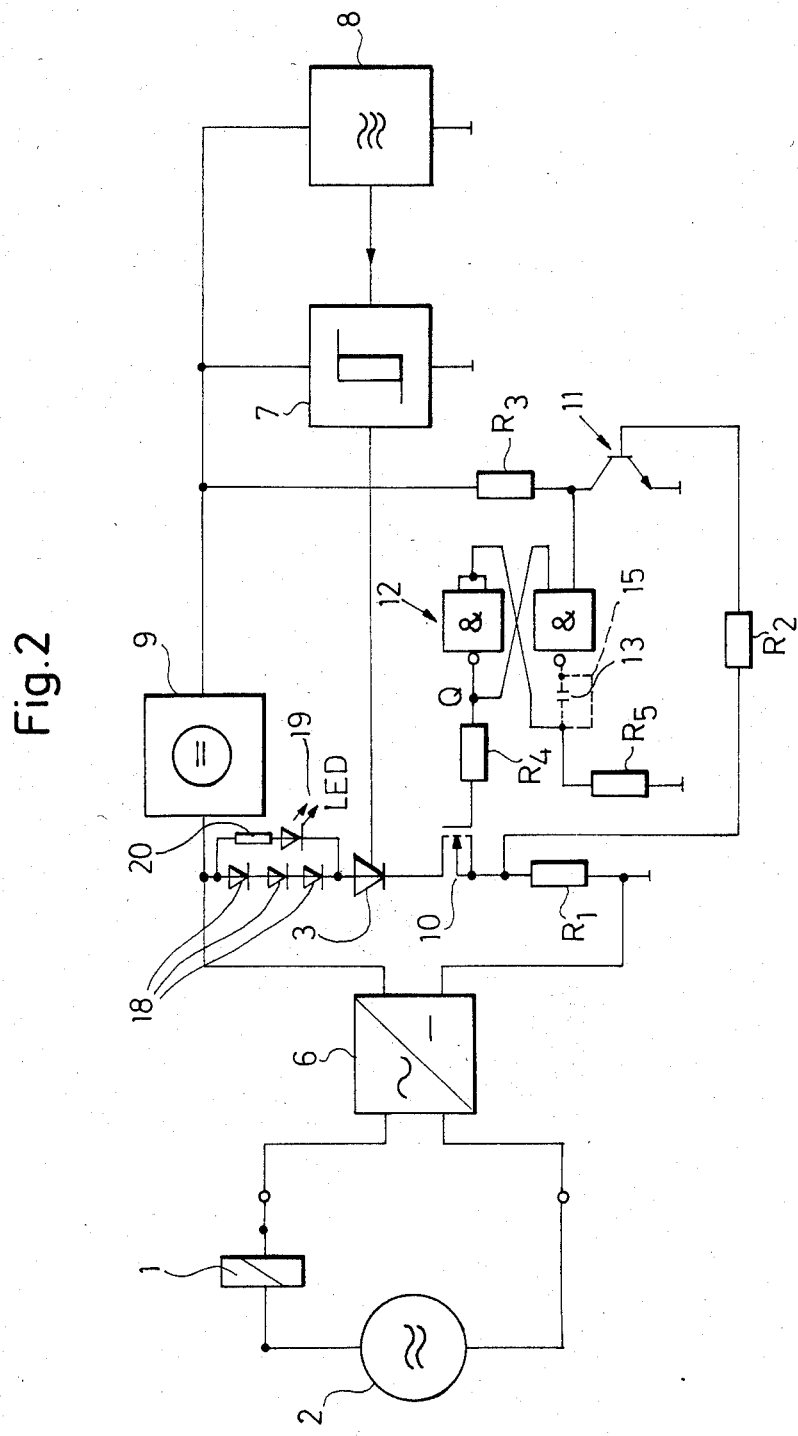
FIG. 2 is a circuit diagram showing details of the circuit according to FIG. 1.

The collector-emitter voltage of the transistor 11 is fed to the input of a flip-flop, designated generally by 12, which, as shown in FIG. 2, consists in a known manner of two consolidated NAND gates. The output Q of the flip-flop 12, which is subjected to the supply voltage when turned on, i.e. the one that conducts the highest potential, is connected to the control electrode of the transistor 10 by means of an resistor $R_4$. The other output of the flip-flop 12, in the exemplary embodiment, is connected to ground by means of a condensor 13 and an resistor $R_5$ connected in series with said condensor 13. The flip-flop, together with the resistors $R_4$ and $R_5$ and the condensor 13, forms the control element of the current control circuit, which, together with the circuit element of the current sensor in FIG. 1 which transfers the signal at element 5 of the current sensor to the input of the flip-flop, join to form the control block designated generally with 14.

The resistor $R_1$ has a value such that the voltage necessary to flow through the transistor 11 drops there, when a predetermined limit value of the current flowing through the thyristor 3 is exceeded. For example, if the base-emitter voltage necessary to flow through the transistor 11 is 0.6 volts and the limit value of the current is 1.4 amps, then the resistor $R_1$ must have a value of 0.42 ohms. In case of a short circuit occurring at the load 1, this limit value of the current would be significantly exceeded, to the extent that the transistor 10 would remain in the conducting condition. However, as soon as the short circuit current has reached the selected limit value, the transistor 11 conducts. Thus, the flip-flop 12 is reset, which means that the potential at its output Q drops to the low level. Because the transistor 10 then has an insufficient control voltage, it switches over into its blocking condition. This has the result that the current flowing through the thyristor 3 and the transistor 10 is reduced to a value smaller than the self-holding current of the thyristor 3, because both a bipolar transistor as well as an MOS-FET transistor have a sufficiently high resistance in the blocked condition. After the current flow level falls below the self-holding level, therefore, the thyristor 3 switches into the blocked condition.

As long as the transistor 10 is blocked, there can be no current flow in the load circuit, although the thyristor 3 continues to receive triggering impulses from the trigger circuit 7. Only after a time period dependent on the size of the condenser 13 does the flip-flop 12 automatically reset, by which means the transistor 10 is brought into the conducting condition then the next triggering implulse fed to the thyristor 3 closes the load electrical circuit. If the short circuit still exists, then a renewed shut-off takes place anew. If, however, the short circuit has been eliminated, then the semi-conductor switch formed by the thyristor 3 is fully functional.

If the condensor 13 is replaced by a bridge 15, as is shown in FIG. 2 by a broken line, then the flip-flop 12 cannot be reset until the supply voltage has been turned off and then turned back on.

Independently of whether the transistor 10 is a bipolar transistor or a MOS-FET transistor, it is possible in accordance with the invention to design the load current circuit with very low resistance. In addition, this circuit makes it possible to shut off the short circuit current even at a very low value, i.e. very quickly, with respect to the cycle duration of the alternating current, by which means both the thermal load and the surge current load of th circuit components can be held quite low. In addition, the number of required circuit components is also very low.

The exemplary embodiment of the circuit arrangement according to the invention is distinguished from the exemplary embodiment according to FIGS. 1 and 2 only by an overload protection, by means of which brief overloads, such as can occur, for example, during the switching of electromagnetic loads, do not lead to a switchover of the transistor 10 into the blocked condition, because these brief overloads do not endanger the semi-conductor switch. With electromagnetic loads, the current peaks can be up to ten times greater than the nominal current for a period of up to about 40 milliseconds. Only when the current peaks are even larger or the duration of the overload is longer, does the protective circuit come into effect.

Figure 3:
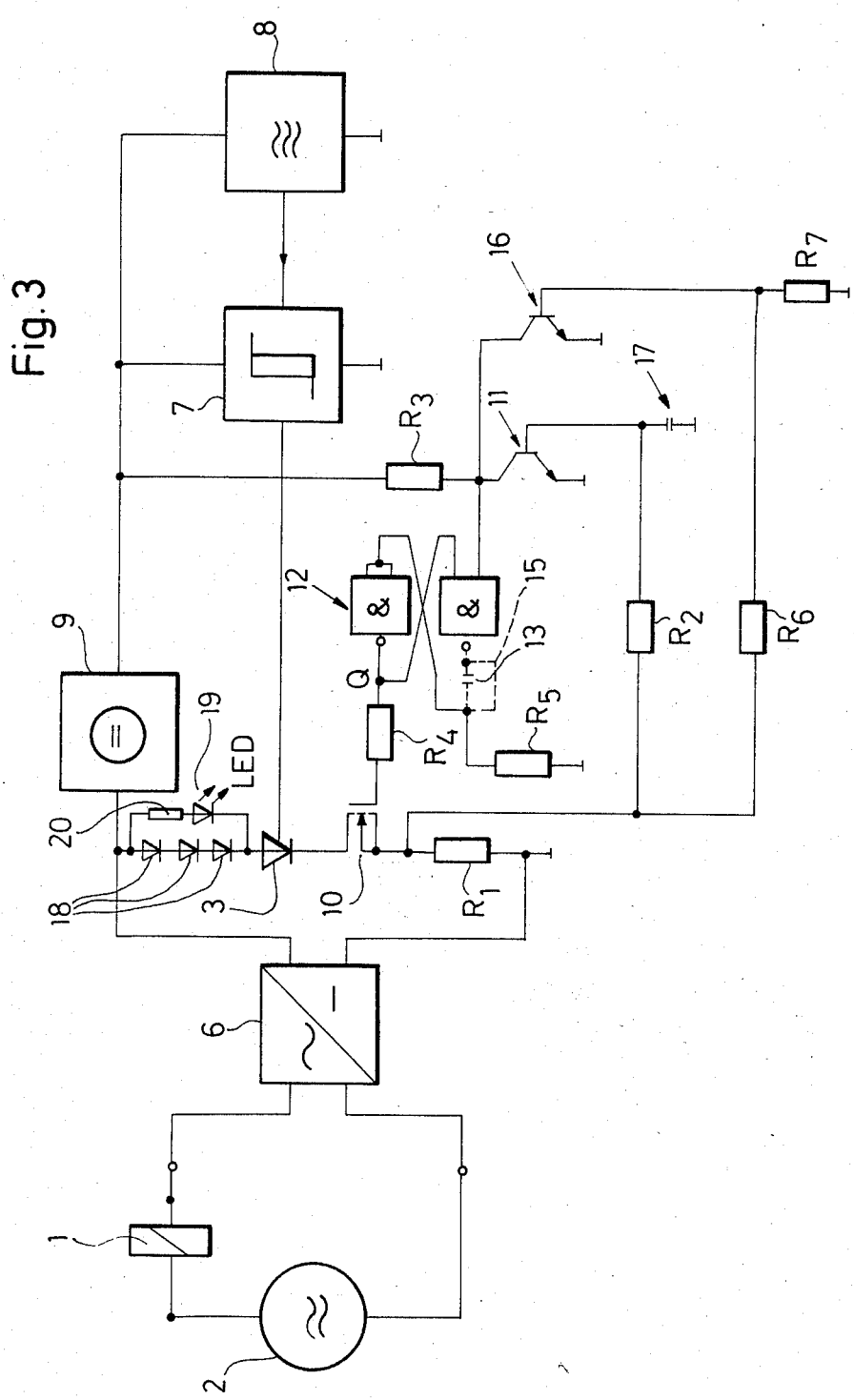
FIG. 3 is a circuit diagram of the second exemplary embodiment.

As FIG. 3 shows, in order to achieve this time delay capability, only one additional condensor 17 is required, which is connected on one side to the base of the transistor 11 and on the other side to ground potential. The condensor 17 thus forms, together with the resister $R_2$, an RC-member connected in parallel with the resistor $R_1$. The time delay in the triggering of the flip-flop 12 and, thereby the blocking of the transistor 10 depends on the dimensioning of the resistor $R_2$ and the condensor 17.

To assure that under larger overloads, which would lead to destruction of the semi-conductor switch, the flip-flop 12 reacts without delay despite the reaction delay provided for lesser overloads, a resistive voltage divider consisting of the resistors $R_6$ and $R_7$ is connected in parallel with the resistor $R_1$, at which a voltage is picked up that is proportional to the current. The base of an additional transistor 16 is connected to the pick-up of this voltage divider, the collector of which transistor 16 is connected to the regulated output voltage of the voltage regulator 9 by means of the resistor $R_3$. The resistance ratio of $R_6$ to $R_7$ determines the upper limit of the current, at which the reaction delay caused by the resistor $R_2$ and the condensor 17 are ineffective and trigger the flip-flop 12 without delay. As a result of this additional circuit element of the current sensor, the reaction threshhold for overload protection does not need to be adjusted to the maximum current, which with electromagnetic loads is much larger than the constant current. Therefore, the load capacity of the thyristor 3 can be more fully utilized without subjecting it to more danger.

As in the exemplary embodiments according to FIGS. 1 and 2, the semi-conductor switch can be made to be automatically reoperational after a brief overload which led to an initiation of the protective circuit.

Both in the exemplary embodiment according to FIGS. 1 and 2 and the exemplary embodiment according to FIG. 3, a series circuit of three diodes 18 is placed in the current path leading from the rectifier bridge 6 to the thyristor 3, in such a manner that they are polarized in the direction of the current flowing through the thyristor 3. The voltage drop produced at the diodes 18 by the current flowing through the thyristor 3 is almost independent of the strength of this current. An LED 19 having series resistance 20 is connected in parallel to the diodes 18. If, after a short circuit or an overload, the transistor 10 suppresses a current flow in the load circuit, the LED 19 does not illuminate. The LED 19 therefore forms a display device for the switch condition of the transistor 10. If it is continually illuminated, it means that the transistor 10 is conducting and the current in the load circuit thus lies below the maximum permissible value and there is no overload or short circuit. Since, in case of a short circuit or overload, the flip-flop 12 switches the transistor 10 back into the conducting condition after a time period determined by the time constants of the RC-member formed by the condensor 13 and the resistor $R_5$, and the current sensor then effects a resetting back into the non-conducting condition if the short circuit or overload condition is not yet ended, the LED 19 blinks with a frequency determined by the interrogation frequency of the flip-flop, which itself is determined by the RC-member, and continues to blink in this manner as long as the short circuit or overload condition continues.

Although only a preferred embodiment is specifically illustrated and described herein, it will be appreciated that many modifications and variations of the present invention are possible in light of the above teachings and within the purview of the appended claims without departing from the spirit and intended scope of the invention.

I claim:

1. A circuit arrangement used in protecting against the overloading of a remotely controllable semiconductor switch which closes or interrupts an alternating current circuit, said circuit arrangement being connected to the direct current output of rectifier means, the input of said rectifier means being connected in the alternating current circuit, said circuit arrangement including said semi-conductor switch, a resistor functioning as a current sensing means and a transistor functioning as a current control means connected in series to the direct current output of said rectifier means and switch control circuit means connected to said current control means, said switch control circuit means including a control element which determines the condition of the current control means based on the voltage drop at the current sensing means, wherein the switch control circuit means (14) includes a flip-flop (12) which produces the control signals for the current control means, and a capacitor (17) is connected to a second resistor ($R_2$) to form an RC element connected in parallel with the current sensing means.

2. Circuit arrangement according to claim 1, wherein the flip-flop (12) is formed of two NAND gates.

3. Circuit arrangement according to claim 1, wherein the current sensing means includes a first transistor (11), the control input of which is connected through said second resistor ($R_2$) to the output of said current control means, and the input of the flip-flop (12) is connected to the output of the transistor (11).

4. Circuit arrangement according to claim 3, wherein the capacitor (17) is connected to the control input of the first transistor (11), which capacitor, together with said second resistor ($R_2$) forms an RC element connected in parallel with said current sensing means.

5. Circuit arrangement according to claim 3 or 4, wherein the current sensing means includes a second transistor (16), the output voltage of said second transistor is fed to the input of the flipflop (12) and the control input of said second transistor is connected to voltage divider means ($R_6$, $R_7$), which is connected in parallel with said current sensing means.

6. Circuit arrangement according to claim 1 further including an illuminating display device (18, 19, 20) which displays the switch condition of the first transistor (4, 10).

7. Circuit arrangement according to claim 6, wherein the illuminating display device includes at least one diode (18) connected in the current path passing through the semi-conductor switch (3), the current control means (4, 10) and the current sensing means ($R_1$), and includes an illuminating diode (19) connected in parallel to the at least one diode (18).

* * * * *